United States Patent
Xu et al.

(10) Patent No.: US 11,251,763 B2
(45) Date of Patent: Feb. 15, 2022

(54) AUDIO SIGNAL ADJUSTMENT METHOD, STORAGE MEDIUM, AND TERMINAL

(71) Applicant: GUANGDONG OPPO MOBILE TELECOMMUNICATIONS CORP., LTD., Guangdong (CN)

(72) Inventors: Zhaoan Xu, Guangdong (CN); Fenggui Yan, Guangdong (CN); Gaoting Gan, Guangdong (CN); Zhiyong Zheng, Guangdong (CN); Hai Yang, Guangdong (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 0 days.

(21) Appl. No.: 16/790,991

(22) Filed: Feb. 14, 2020

(65) Prior Publication Data
US 2020/0186114 A1 Jun. 11, 2020

Related U.S. Application Data

(63) Continuation of application No. PCT/CN2017/098173, filed on Aug. 18, 2017.

(51) Int. Cl.
*H03G 3/30* (2006.01)
*G06F 3/16* (2006.01)
(Continued)

(52) U.S. Cl.
CPC .......... *H03G 3/3005* (2013.01); *G06F 3/165* (2013.01); *G10L 25/51* (2013.01); *H04R 3/00* (2013.01);
(Continued)

(58) Field of Classification Search
CPC .... H04R 3/00; H04R 2430/01; H04R 29/001; H03G 3/3005; H03G 2201/103; G06F 3/165
See application file for complete search history.

(56) References Cited

U.S. PATENT DOCUMENTS

| 2012/0099829 A1 | 4/2012 | Moberg et al. |
| 2013/0024190 A1 | 1/2013 | Fairey |
| 2014/0079212 A1 | 3/2014 | Sako et al. |

FOREIGN PATENT DOCUMENTS

| CN | 1819452 A | 8/2006 |
| CN | 102907077 A | 1/2013 |

(Continued)

OTHER PUBLICATIONS

English machine translation of JP 2010-141806, 20 pages. (Year: 2010).*

(Continued)

*Primary Examiner* — Ping Lee
(74) *Attorney, Agent, or Firm* — Young Basile Hanlon & MacFarlane, P.C.

(57) ABSTRACT

An audio signal adjustment method, a storage medium, and a terminal are provided. The method may include: when it is detected that a pre-set event is triggered, controlling a microphone to acquire an audio signal, the pre-set event comprising a pre-set call event and/or a pre-set voice recording event; analyzing the sound loudness corresponding to the audio signal; dynamically adjusting, according to the analysis result and a pre-set adjustment policy, the sound loudness corresponding to the audio signal; and performing, according to the type of the pre-set event, corresponding output processing on the adjusted audio signal.

9 Claims, 6 Drawing Sheets

(51) Int. Cl.
    *G10L 25/51*     (2013.01)
    *H04R 3/00*     (2006.01)
    *H04R 29/00*     (2006.01)

(52) U.S. Cl.
    CPC ..... *H04R 29/001* (2013.01); *H03G 2201/103* (2013.01); *H04R 2430/01* (2013.01)

(56) References Cited

FOREIGN PATENT DOCUMENTS

| | | | |
|---|---|---|---|
| CN | 103219026 A | | 7/2013 |
| CN | 106231498 A | | 12/2016 |
| CN | 106791163 A | | 5/2017 |
| CN | 107172255 A | | 9/2017 |
| JP | 2003219243 A | | 7/2003 |
| JP | 2010141806 | * | 6/2010 |
| KR | 20170001125 A | | 1/2017 |
| WO | 2017047000 A1 | | 3/2017 |

OTHER PUBLICATIONS

International Search Report for PCT/CN2017/098173 dated May 21, 2018.
European Search Report, European Application No. 17922059.5, dated Jul. 21, 2020 (9 pages).
Indian First Examination Report for IN Application 202017011414 dated May 21, 2021. (6 pages).

* cited by examiner

AUDIO SIGNAL ADJUSTMENT METHOD, STORAGE MEDIUM, AND TERMINAL

CROSS-REFERENCE TO RELATED APPLICATION(S)

The present application is a continuation application of International (PCT) Patent Application No. PCT/CN2017/098173 filed on Aug. 18, 2017, the entire disclosure of which is hereby incorporated by reference.

TECHNICAL FIELD

Embodiments of the present disclosure relate to the audio processing technical field, and in particular, to an audio signal adjustment method, a storage medium, and a terminal.

BACKGROUND

In order to meet users' requirements in life and work, such as voice calls, video calls, sound recording, and the like, most terminals, for examples, mobile phones, tablet computers, music players, recorder pens, and so on, have calling or recording functions.

Generally, a mobile terminal implements a calling or recording function by an integrated microphone (abbreviated as mic, also called sound transmitter). A microphone is a kind of energy conversion element converting sound signals into electric signals, when vibration of sound transmits to a vibration membrane of the microphone, it will cause a magnet therein to form a changing current signal; the current signal is processed by a sound processing circuit and then transmitted to an opposite call end or stored, so that calling or recording is implemented.

SUMMARY

Embodiments of the present disclosure provide an audio signal adjustment method, a storage medium, and a terminal, which can automatically adjust recorded audio signals in a calling or recording process.

In a first aspect, an embodiment of the present disclosure provides an audio signal adjustment method, comprising: when it is detected that a preset event is triggered, controlling a microphone to acquire an audio signal, wherein the preset event comprises a preset call event and/or a preset recording event; analyzing a sound loudness corresponding to the audio signal; dynamically adjusting the sound loudness corresponding to the audio signal according to an analysis result and a preset adjustment policy; and performing corresponding output processing for an adjusted audio signal according to a type of the preset event.

In a second embodiment, an embodiment of the present disclosure provides a non-transitory computer readable storage medium, which stores a computer program, wherein the program, when being executed by a processor, implements audio signal adjustment according to an embodiment of the present disclosure.

In a third aspect, an embodiment of the present disclosure provides a mobile terminal, comprising: a microphone, a memory, a processor, and a computer program stored in the memory and being executable by the processor; wherein the processor implements an audio signal adjustment method according to an embodiment of the present disclosure when executing the computer program.

BRIEF DESCRIPTION OF DRAWINGS

In order to describe technical solutions of embodiments of the present disclosure more clearly, drawings required being used in the description of the embodiments will be simply introduced below. Obviously, the drawings in the following description are merely some embodiments of the present disclosure. For one of ordinary skill in the art, it is possible to obtain other drawings according to these drawings without paying any creative work.

DETAILED DESCRIPTION

Technical solutions of the present disclosure are further described below with reference to the drawings and by specific embodiments. It can be understood that the specific embodiments described here are merely intended to illustrate the present disclosure but not to limit the present disclosure. Additionally, it needs to be explained that the drawings only show some structures relating to the present disclosure, but not all structures, in order to describe conveniently.

Prior to discuss the illustrative embodiments more particularly, it should be noted that some of the illustrative embodiments are described as processes or methods depicted as flow charts. Although a flow chart describes steps as a sequential processing, many of the steps can be implemented in parallel, concurrently, or simultaneously. Moreover, the sequence of these steps can be re-arranged. When an operation is completed, the processing can be terminated, but there can also be additional steps not included in the drawings. The processing can correspond to methods, functions, procedures, subroutines, subprograms, and so on.

An embodiment of the present disclosure provides an audio adjustment method, wherein the method comprises: when it is detected that a preset event is triggered, controlling a microphone to acquire an audio signal, wherein the preset event comprises a preset call event and/or a preset recording event; analyzing a sound loudness corresponding to the audio signal; dynamically adjusting the sound loudness corresponding to the audio signal according to an analysis result and a preset adjustment policy; and performing corresponding output processing for an adjusted audio signal according to a type of the preset event.

Optionally, the performing corresponding output processing for an adjusted audio signal according to a type of the preset event comprises: when the preset event includes a preset call event, sending the adjusted audio signal to an opposite call end; when the preset event includes a preset recording event, storing the adjusted audio signal as a recording signal.

Optionally, the analyzing a sound loudness corresponding to the audio signal comprises: analyzing amplitude information of the audio signal to obtain a sound loudness analysis result.

Optionally, the analyzing amplitude information of the audio signal to obtain a sound loudness analysis result comprises: extracting amplitude information corresponding to persons' sound in the audio signal; analyzing the amplitude information corresponding to person's sound to obtain the sound loudness analysis result.

Optionally, the dynamically adjusting the sound loudness corresponding to the audio signal according to an analysis result and a preset adjustment policy comprises: when the sound loudness analysis result includes that a current sound loudness is less than a first preset loudness threshold value, performing raising adjustment for the current sound loudness; and/or when the sound loudness analysis result includes that a current sound loudness is larger than a second preset loudness threshold value, performing lowering adjustment for the current sound loudness.

Optionally, the when the sound loudness analysis result includes that a current sound loudness is less than a first preset loudness threshold value, performing raising adjustment for the current sound loudness comprises: when a current amplitude value in the audio signal is less than a first preset amplitude threshold value, adjusting the current amplitude value into a corresponding first target amplitude, wherein the first target amplitude is larger than or equal to the first preset amplitude threshold value; the when the sound loudness analysis result includes that a current sound loudness is larger than a second preset loudness threshold value, performing lowering adjustment for the current sound loudness comprises: when a current amplitude value in the audio signal is larger than a second preset amplitude threshold value, adjusting the current amplitude value into a corresponding second target amplitude, wherein the second target amplitude is less than or equal to the second preset amplitude threshold value.

Optionally, the adjusting the current amplitude value into a corresponding first target amplitude comprises: determining the corresponding first target amplitude according to the current amplitude value and a first preset correspondence relationship; determining a corresponding first gain adjustment parameter value according to the first target amplitude and the current amplitude value; performing signal gain adjustment for a position in the audio signal corresponding to the current amplitude value using the first gain adjustment parameter value; the adjusting the current amplitude value into a corresponding second target amplitude comprises: determining the corresponding second target amplitude according to the current amplitude value and a second preset correspondence relationship; determining a corresponding second gain adjustment parameter value according to the current amplitude value and the second target amplitude; performing signal gain adjustment for a position in the audio signal corresponding to the second amplitude value using the second gain adjustment parameter value.

Optionally, prior to the determining the corresponding first target amplitude according to the current amplitude value and a first preset correspondence relationship, the method further comprises: selecting the first preset correspondence relationship from a plurality of optional first preset correspondence relationships according to a first preset reference factor; prior to the determining the corresponding second target amplitude according to the current amplitude value and a second preset correspondence relationship, the method further comprises: selecting the second preset correspondence relationship from a plurality of optional second preset correspondence relationships according to a second preset reference factor.

Optionally, when the preset event is a preset call event, the selecting the first preset correspondence relationship from a plurality of optional first preset correspondence relationships according to a first preset reference factor comprises: acquiring attribute information of a contact of an opposite call end and/or scene mode information of an opposite call end; selecting the first preset correspondence relationship from a plurality of optional first preset correspondence relationships according to the attribute information and/or the scene mode information; the selecting the second preset correspondence relationship from a plurality of optional second preset correspondence relationships according to a second preset reference factor comprises: acquiring attribute information of a contact of an opposite call end and/or scene mode information of an opposite call end; selecting the second preset correspondence relationship from a plurality of optional second preset correspondence relationships according to the attribute information and/or the scene mode information.

Optionally, the when the sound loudness analysis result includes that a current sound loudness is less than a first preset loudness threshold value, performing raising adjustment for the current sound loudness comprises: acquiring attribute information of a contact of an opposite call end and/or scene mode information of an opposite call end; determining a corresponding first preset loudness threshold value according to the attribute information and/or the scene mode information; when the sound loudness analysis result includes that a current sound loudness is less than the first preset loudness threshold value, performing raising adjustment for the current sound loudness.

Optionally, the when a current amplitude value in the audio signal is less than a first preset amplitude threshold value, adjusting the current amplitude value into a corresponding first target amplitude comprises: acquiring attribute information of a contact of an opposite call end and/or scene mode information of an opposite call end; determining a corresponding first preset amplitude threshold value according to the attribute information and/or the scene mode information; when a current amplitude value in the audio signal is less than the first preset amplitude threshold value, adjusting the current amplitude value into the corresponding first target amplitude.

Optionally, the acquiring scene mode information of an opposite call end can specifically comprise: sending a scene mode information acquiring request to the opposite call end; receiving scene mode information returned according to the scene mode information acquiring request by the opposite call end.

Figure 1:
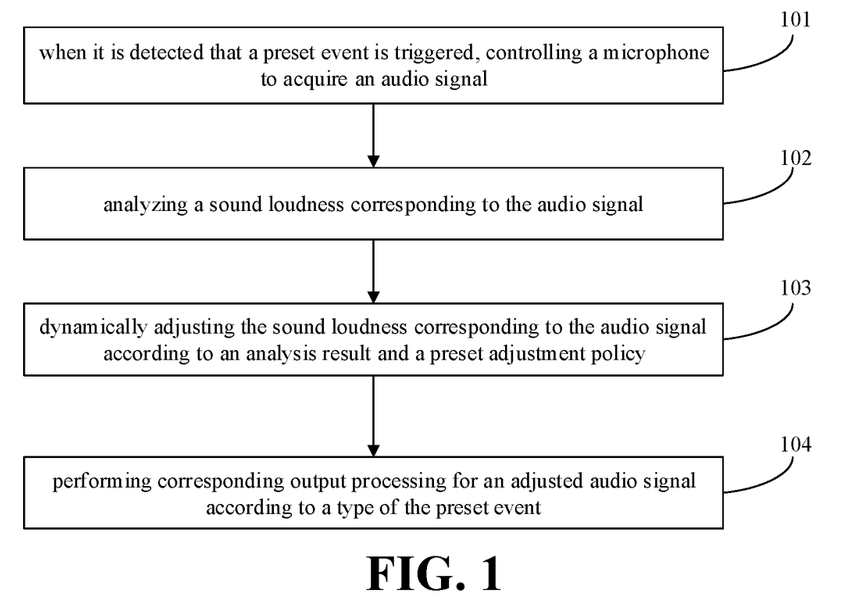
FIG. 1 is a schematic flow chart of an audio signal adjustment method provided by an embodiment of the present disclosure.

FIG. 1 is a schematic flow chart of an audio signal adjustment method provided by an embodiment of the present disclosure. The method can be executed by an audio signal adjustment device, wherein the device can be implement by software and/or hardware, which can usually be integrated in a terminal. As shown in FIG. 1, the method comprises the following operations.

Operation 101, when it is detected that a preset event is triggered, a microphone is controlled to acquire an audio signal.

In this embodiment, the preset event comprises a preset call event and/or a preset recording event.

Illustratively, the terminal in embodiments of the present disclosure can include devices equipped with microphones, such as mobile phones, tablet computers, music players, voice recorders, and so on. The microphones can be built-in, and can also be external. A microphone (abbreviated as mic, also called sound transmitter or speaking trumpet) is a kind of energy conversion element for converting sound signals into electric signals, when vibration of sound transmits to a vibrating membrane of a microphone, it can cause a magnet therein to form a changing current signal, the current signal is processed by a sound processing circuit and then transmitted to an opposite call end or stored, so that calling or recording is implemented. Embodiments of the present disclosure do not limit specific types, numbers, and positions of microphones, for example, regarding a mobile phone, there can be one or more electret microphone(s) disposed on a bottom side surface of the mobile phone.

Illustratively, the preset call event can be a call event having an audio signal adjustment function of embodiments of the present disclosure; the present recording event can be a recording event having an audio signal adjustment function of embodiments of the present disclosure. Optionally, when an audio signal adjustment is in a switch-on state and a call event or a recording event is detected, it can be determined that the preset call event or the preset recording event is detected. The call event can be, for example, connection of a call or connection of a voice chat; the recording event can be, for example, starting recording. When the preset event includes both the preset call event and the preset recording event, it can be considered as switching on a calling recording function, that is, recording calling content during a process of calling with an opposite end.

In order to facilitate appreciation of embodiments of the present disclosure, taking a smart phone as an example, an audio processing hardware system and a system structure are briefly described below.

Figure 2:
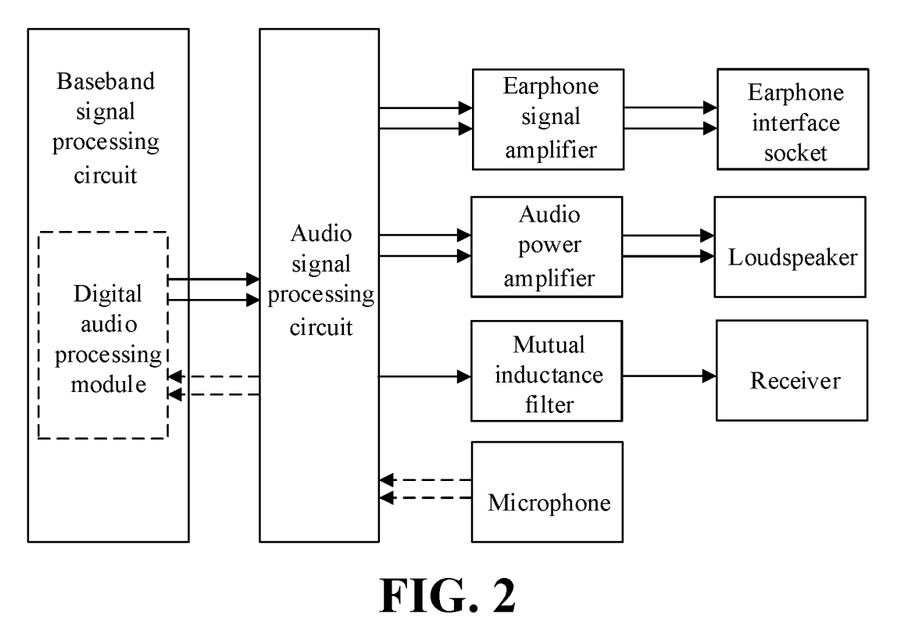
FIG. 2 is a structural schematic view of an audio processing hardware system of a smart phone provided by an embodiment of the present disclosure.

FIG. 2 is a structural schematic view of an audio processing hardware system of a smart phone provided by an embodiment of the present disclosure. An audio processing circuit is usually disposed in a main control circuit board, since designs of different mobile phones are different, specific positions of audio processing circuits may also be different. An audio processing circuit of a smart phone mainly includes an audio signal processing circuit, a baseband signal processing circuit, an audio power amplifier, an earphone signal amplifier, a receiver, a loudspeaker, a microphone, an earphone interface, etc. Wherein, the audio signal processing circuit is a core of the whole audio processing circuit. The audio processing circuit is mainly composed of an audio receiving circuit, a transmitter circuit, an earphone calling circuit, etc., and further includes analog/digital (A/D) conversion, digital/analog (D/A) conversion, digital voice signal processing, and analog audio amplifying circuits, etc., which are configured for analog audio.

When calling, first, a microphone in a local call end converts a mechanic sound wave signal of sound into an analog audio signal, which is amplified by an analog audio amplified circuit, and a built-in multimode converter performs A/D conversion to obtain a digital audio signal; second, the digital audio signal is transmitted to a baseband processor to perform processing such as voice coding, channel coding, etc.; third, a series of processing, such as encryption, interweaving, and so on, are performed; finally, the signal is transmitted to a digital narrow band modulation module in the baseband processor to modulate, a transmission baseband signal is generated and sent to a radio frequency circuit to be modulate into a transmission intermediate frequency and sent to an opposite call party.

When recording, similar to the above procedure, first, a mechanical sound wave signal of sound is converted into an analog audio signal by a microphone, and amplified by an analog audio amplifying circuit; through A/D conversion, a digital audio signal is obtained, and is encoded and stored according to a preset audio format.

In embodiments of the present disclosure, an audio signal acquired by a microphone can be an aforementioned analog audio signal converted from a mechanical sound wave signal, can also be an amplified analog audio signal, and can further be a digital audio signal after A/D conversion, etc., embodiments of the preset disclosure do not limit here.

Figure 3:
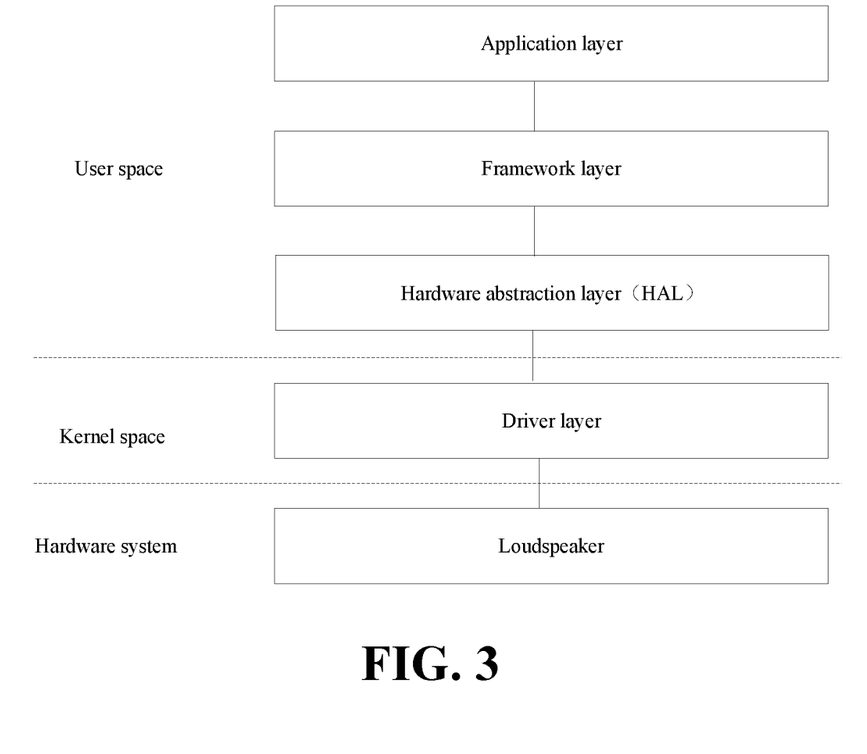
FIG. 3 is a structural diagram of an audio system provided by an embodiment of the present disclosure.

As shown in FIG. 3, an audio system structure provided by this embodiment mainly comprises user space, kernel space, and a hardware system. The user space includes an application layer, an application framework layer, and a hardware abstraction layer (HAL), the kernel space includes a driver layer. The application layer is the uppermost layer of the audio system, it is possible to write an application program to execute corresponding logic operations, for example, detecting an application program triggering a recording event, presetting standard audio conditions, issuing audio playing instruction, and so on. The application framework layer includes an audio control interface, a standardized plug-in module responsible for providing an audio playing form control interface, a loudspeaker volume control interface, and so on. The application framework layer provides two categories: Audiotrack and AudioRecorder, and further provides AudioManager, AudioService, and AudioSystem categories. Between the application framework layer and the hardware abstraction layer, a system running libraries layer is further included. As well known, many categories in the framework layer are actually merely "intermedia" for application programs to use files of Android libraries. Since upper applications are usually written by java language, they need the most direct support of a java interface, this is one of the meanings of the existence of the framework layer. However, as "intermedia", they will not really implement specific functions, or only implement some of the functions, but the main focus is completed in the libraries. For example, the aforementioned AudioTrack, AudioRecorder, MediaPlayer, MediaRecorder, etc., can find corresponding categories in libraries. These parts of codes are centralized in frameworks/av/media/libmedia of a project, and are mostly written by C++ language. A hardware abstraction layer in an audio aspect is mainly divided into two parts, that is, AudioFlinger and AudioPolicyService. In fact, the latter is not a real device, but only adopts a manner of a virtual device to enable manufacturers to easily customize their own strategies. According to differences of products, audio devices have great differences; in an Android audio structure, these problems are all solved by audio.primary of the HAL, and do not need to be implemented by a large scale modification on an upper layer. The hardware abstraction layer is a transition from the application framework layer to the drive layer for implementing compatibility of underlying hardware. The drive layer controls an audio codec according to characteristics of the audio codec, so as to ensure that the audio codec can work normally, and provides audio data acquired by the audio codec to the system layer. In embodiments of the present disclosure, when performing acquirement for audio signals, the mainly involved category is the aforementioned AudioRecorder category.

Operation 102, a sound loudness corresponding to the audio signal is analyzed.

Three main attributes of sound are volume, tone, and timbre. Wherein, volume is also called loudness or sound strength, and refers to subjective feeling of a human ear for a size and strength of heard sound, its objective evaluation scale is an amplitude size of sound. Amplitude refers to the largest distance of an object deviating from an original position during vibration, a loudness of sound heard by a human ear is relevant to an amplitude of a sound source, generally, the larger the amplitude, the stronger the loudness.

Illustratively, although a user can hear the sound size of his/her speaking during a call, the user is unable to know whether a current speaking volume is large or small sound for a person at an opposite call end; if the sound is too small, the opposite party may be unable to hear clearly; if the sound is too large, it may make the opposite party to feel deafening. The user can also hear a sound size of his/her own speaking when recording, but is unable to know a size of his/her own sound recorded by a terminal; if the sound is too small, it may not be heard clearly when playing recording; if the sound is too large, it may make a listener feel uncomfortable when playing recording. Moreover, there are also many reasons which may result in that sound acquired by a microphone is affected by a speaker himself/herself or a calling state and a recording state. For example, different persons have different speaking habits, some persons speak with softer voice, while some persons speak with louder voice; for another instance, during a speaking process, it may be difficult for a user to maintain a constant distance between a sound source (e.g., a mouth of the user) and a microphone, for example, when the user is in a moving state or in a bumpy vehicle, these may result in that sound acquired by the microphone is sometimes large and sometimes small. All of the above situations may generate bad effect on an opposite call party or persons listening recording. In this embodiment of the present disclosure, a sound loudness corresponding to the audio signal is analyzed, so as to real-timely know whether a sound loudness corresponding to an audio signal acquired by a terminal is suitable.

Illustratively, it is possible to preset time intervals as analyzing units, a size of a sound loudness in every preset time interval is analyzed, and a sound loudness corresponding to a current preset time interval can be recorded as a current sound loudness. A preset time interval can be a preset time length starting from a current time and timing forwards. In order to ensure real-time, the preset time length corresponding to the preset time interval can be set to be short, for example, can be in 0.5 second starting from a current time and timing forwards.

Operation S103, according to an analysis result and a preset adjustment policy, the sound loudness corresponding to the audio signal is dynamically adjusted.

An illustrative preset adjustment policy can be determined according to a preset sound loudness changing law. For instance, if a preset sound loudness changing law is that a sound loudness changes evenly, when a sound loudness is large, lowering adjustment can be performed for a sound loudness corresponding to an audio signal, for example, it is possible to reduce an amplifying multiple for amplifying an analog audio signal, that is, to lower a gain value; when a sound loudness is small, raising adjustment can be performed for a sound loudness corresponding to an audio signal, for example, it is possible to increase an amplifying multiple for amplifying an analog audio signal, that is, to increase a gain value.

Operation S104, according to a type of the preset event, corresponding output processing is performed for an adjusted audio signal.

Illustratively, when the preset event includes a preset call event, an adjusted audio signal is transmitted to an opposite call end; optionally, aforementioned processing such as voice coding, channel coding, and so on, can also be performed prior to transmission, embodiments of the present disclosure do not limit this. When the preset event includes a preset recording event, an adjusted audio signal is stored as a recording signal; optionally, aforementioned processing such as coding according to a preset audio format can also be performed prior to transmission, embodiments of the present disclosure do not limit this. When the preset event includes both a preset call event and a preset recording event, that is, a call recording function is started, an adjusted audio signal is stored as a recording signal at the same time of transmitting the adjusted audio signal to an opposite call end.

In the audio signal adjustment method provided by the embodiment of the present disclosure, during a call or recording process, it is possible to analyze a sound loudness corresponding to an audio signal acquired by a microphone, perform dynamical adjustment according to an analysis result, and then perform corresponding output processing. It is not required that an opposite call end itself adjusts a volume, or it is not required that a listener adjusts a volume back and forth when playing recording, and it can be maintained that an audio signal is output according to a preset volume changing law.

In some embodiments, the analyzing a sound loudness corresponding to the audio signal can comprise: analyzing amplitude information of the audio signal to obtain a sound loudness analysis result. As detailed above, an objective evaluation scale of a sound loudness is an amplitude size of sound; since an audio signal is converted from a mechanical sound wave signal of sound, it is possible to adopt amplitude information to analyze a sound loudness of an audio signal. The larger the amplitude, the larger the sound loudness, that is, the higher the energy value of sound. Illustratively, it is possible to preset time intervals as analyzing units, in the preset time intervals, an amplitude of an audio signal is acquired at a preset sampling frequency, a plurality of amplitude values (absolute values) are acquired, and an average amplitude value in the preset time intervals is considered as a current sound loudness. Here, it is preferred to convert analysis for a sound loudness into analysis for amplitude information, an analyzing process can be simplified, and analyzing speed is improved.

In some embodiments, the analyzing amplitude information of the audio signal to obtain a sound loudness analysis result can further comprise: extracting amplitude information corresponding to persons' sound in the audio signal; analyzing the amplitude information corresponding to person's sound to obtain the sound loudness analysis result. Illustratively, in a call process, persons' sound is a main portion in an audio signal, and other environmental sound can be considered as interfering sound. Moreover, when recording, a user can choose a person sound recording mode, at this time, persons' sound is also a main portion in an audio signal, and other environmental sound can be considered as interfering sound. In these situations, when amplitude information corresponding to persons' sound in the audio signal is extracted, data requiring to be analyzed can be significantly reduced, so that an analyzing speed is improved; it is also possible to adjust the audio signal more timely, this is conducive to further improve adjusting timeliness aiming at a call state or a recording state.

In some embodiments, the dynamically adjusting the sound loudness corresponding to the audio signal according to an analysis result and a preset adjustment policy can comprise: when the sound loudness analysis result includes that a current sound loudness is less than a first preset loudness threshold value, performing raising adjustment for the current sound loudness; and can also comprise: when the sound loudness analysis result includes that a current sound loudness is larger than a second preset loudness threshold value, performing lowering adjustment for the current sound loudness. Of course, both the above two methods can also be comprised. The first preset loudness threshold value and the second preset loudness threshold value can be the same, and can also be different; their specific values can be preset fixed values, and can also be changing values dynamically adjusted according to actual situations.

Illustratively, when the current sound loudness is less than the first preset loudness threshold value, it can be indicated that the current sound loudness of the audio signal is small, an opposite call end may be unable to clearly hear what the local end user says, or when a recording file is played later, it may be caused that other persons cannot clearly hear currently recorded sound. Therefore, the raising adjustment is performed for the current sound loudness, so that the sound loudness of the output audio signal is increased. Illustratively, when the current sound loudness is larger than or equal to the first preset loudness threshold value, it is also possible not to perform adjustment. Advantages of such a design are that it is suitable for application scenes having no requirement for an upper limit of the sound loudness and can ensure adjustment efficiency.

Illustratively, when the current sound loudness is larger than the second preset loudness threshold value, it can be indicated that the current sound loudness of the audio signal is large, when transmitting to an opposite call end, it may be caused that the opposite party to feel deafening, or when a recording file is played later, it may be caused that a volume is too large and affect listening. Therefore, the lowering adjustment is performed for the current sound loudness, so that the sound loudness of the output audio signal is reduced. Illustratively, when the current sound loudness is less than or equal to the second preset loudness threshold value, it is also possible not to perform adjustment. Advantages of such a design are that it is suitable for application scenes having no requirement for a lower limit of the sound loudness and can ensure adjustment efficiency.

Illustratively, the above two adjusting methods can be combined, that is, both when the current sound loudness is small and when the current sound loudness is large, adjustment is performed; when the current sound loudness is larger than or equal to the first preset loudness threshold value and is less than or equal to the second preset loudness threshold value, it is indicated that the sound loudness of the current audio signal is suitable, and it is possible not to perform adjustment. Advantages of such a design are that it is suitable for application scenes having requirements for both an upper limit and a lower limit of the sound loudness and can ensure adjustment effect.

In some embodiments, the when the sound loudness analysis result includes that a current sound loudness is less than a first preset loudness threshold value, performing raising adjustment for the current sound loudness comprises: when a current amplitude value in the audio signal is less than a first preset amplitude threshold value, adjusting the current amplitude value into a corresponding first target amplitude, wherein the first target amplitude is larger than or equal to the first preset amplitude threshold value. The first preset amplitude threshold value can be a fixed value, and can also be a dynamically changing value determined according to actual situations. Advantages of such a design are that the adjustment for the sound loudness can be implemented by adjusting the amplitude value, the adjusting speed is quick, the efficiency is high, and timeliness of outputting the audio signal can be further ensured.

In some embodiments, the when the sound loudness analysis result includes that a current sound loudness is larger than a second preset loudness threshold value, performing lowering adjustment for the current sound loudness comprises: when a current amplitude value in the audio signal is larger than a second preset amplitude threshold value, adjusting the current amplitude value into a corresponding second target amplitude, wherein the second target amplitude is less than or equal to the second preset amplitude threshold value. Advantages of such a design are that the adjustment for the sound loudness can be implemented by adjusting the amplitude value, the adjusting speed is quick, the efficiency is high, and timeliness of outputting the audio signal can be further ensured.

In some embodiments, the adjusting the current amplitude value into a corresponding first target amplitude can comprise: determining the corresponding first target amplitude according to the current amplitude value and a first preset correspondence relationship; determining a corresponding first gain adjustment parameter value according to the first target amplitude and the current amplitude value; performing signal gain adjustment for a position in the audio signal corresponding to the current amplitude value using the first gain adjustment parameter value. Advantages of such a design are that first target amplitudes corresponding to different amplitude values can be preset in a first preset correspondence relationship, a first target amplitude corresponding to a current amplitude value can be determined quickly, so that adjustment efficiency is improved. The first preset correspondence relationship can, for example, exist in the form of a mapping table, and can be determined by methods such as experiments, simulations, etc. When the first target amplitude corresponding to the current amplitude value has been determined, a corresponding first gain adjustment coefficient can be determined according to a quotient of the first target amplitude and the current amplitude value, and signal gain adjustment can be performed to a position of the current amplitude value according to the first gain adjustment coefficient. For example, assuming that the first gain adjustment coefficient is K1 (larger than 1), the original gain value is G, thus the current gain value can be K1*G; if amplitude values in other positions do not require adjustment, when the amplitude values in other positions are amplified by an analog audio amplifier circuit, the gain value is G; however, when the current amplitude value is amplified, the gain value is adjusted into K1*G, so that the sound loudness in the position corresponding to the current amplitude value is increased.

Similarly, the adjusting the current amplitude value into a corresponding second target amplitude can comprise: determining the corresponding second target amplitude according to the current amplitude value and a second preset correspondence relationship; determining a corresponding second gain adjustment parameter value according to the current amplitude value and the second target amplitude; performing signal gain adjustment for a position in the audio signal corresponding to the second amplitude value using the second gain adjustment parameter value. Advantages of such a design are that second target amplitudes corresponding to different amplitude values can be preset in a first preset correspondence relationship, a second target amplitude corresponding to a current amplitude value can be determined quickly, so that adjustment efficiency is improved. The second preset correspondence relationship can, for example, exist in the form of a mapping table, and can be determined by methods such as experiments, simulations, etc. When the second target amplitude corresponding to the current amplitude value has been determined, a corresponding second gain adjustment coefficient can be determined according to a quotient of the second target amplitude and the current amplitude value, and signal gain adjustment can be performed to a position of the current amplitude value according to the second gain adjustment coefficient. For example, assuming that the second gain adjustment coefficient is K2 (less than 1), the original gain value is G, thus the current gain value can be K2*G; if amplitude values in other positions do not require adjustment, when the amplitude values in other positions are amplified by an analog audio amplifier circuit, the gain value is G; however, when the current amplitude value is amplified, the gain value is adjusted into K2*G, so that the sound loudness in the position corresponding to the current amplitude value is reduced.

In some embodiments, prior to the determining the corresponding first target amplitude according to the current amplitude value and a first preset correspondence relationship, the method further comprises: selecting the first preset correspondence relationship from a plurality of optional first preset correspondence relationships according to a first preset reference factor. Advantages of such a design are that a plurality of first preset correspondence relationships can be preset, the first preset correspondence relationship is dynamically selected according to actual situations of current call or recording, so that adjustment for the sound loudness is more targeted. Illustratively, when the preset event is a preset call event, a required first preset correspondence relationship can be selected according to an actual requirement for a sound loudness of the opposite call end. When the preset event is a preset recording event, a required first preset correspondence relationship can be selected according to an actual recording requirement or recording environment, such as a recording distance, a type or a strength of environmental noise, a recording mode, etc. Similarly, prior to the determining the corresponding second target amplitude according to the current amplitude value and a second preset correspondence relationship, the method can further comprise: selecting the second preset correspondence relationship from a plurality of optional second preset correspondence relationships according to a second preset reference factor. Advantages of such a design are that a plurality of second preset correspondence relationships can be preset, the second preset correspondence relationship is dynamically selected according to actual situations of current call or recording, so that adjustment for the sound loudness is more targeted.

In some embodiments, when the preset event is a preset call event, the selecting the first preset correspondence relationship from a plurality of optional first preset correspondence relationships according to a first preset reference factor comprises: acquiring attribute information of a contact of an opposite call end and/or scene mode information of an opposite call end; selecting the first preset correspondence relationship from a plurality of optional first preset correspondence relationships according to the attribute information and/or the scene mode information. Advantages of such a design are that the first present correspondence relationship can be determined more accurately according to actual situations of the opposite call end, and call effect is further improved.

Illustratively, the attribute information can include ages (or age groups), or include whether being an old man, whether being a child, etc. Optionally, the acquiring attribute information of a contact of an opposite call end can comprise: acquiring remark information of a contact of an opposite call end in an address book, and extracting attribute information from the remarks information; and can also comprise performing voice recognition for sound of a contact of an opposite call end, and determining corresponding attribute information according to a recognition result. When the opposite party is an old man, his/her hearing may be poor, a required sound loudness should be large; therefore, the first preset correspondence relationship of which the first target amplitude is set to be high can be chosen.

Illustratively, scene mode information of the opposite call end can include mode information such as a silent mode, a conference mode, a normal mode, an outdoor mode, etc. A user usually can set a corresponding scene mode according to an environment where he/she is located, for example, in relatively quiet environments, such as a class, a meeting, etc., a silent mode or a conference mode may be selected; in an outside noisy environment, an outdoor mode may be selected; when answering phones in these environments, there may be different requirements for a sound loudness. For example, in a conference mode, since the environment is relatively quiet, a sound loudness does not need to be very large and the opposite party's sound can be heard clearly; however, in an outdoor mode, since the environment is relatively noisy, a relatively larger sound loudness is required to clearly hear the opposite party's sound. Based on the above reasons, mapping relationships between different scene modes and different first preset correspondence relationships can be preset; in actually call processes, a corresponding first preset correspondence relationship can be determined according to acquired scene mode information. Optionally, the acquiring scene mode information of an opposite call end can specifically comprise: sending a scene mode information acquiring request to the opposite call end; receiving scene mode information returned according to the scene mode information acquiring request by the opposite call end.

Similarly, the selecting the second preset correspondence relationship from a plurality of optional second preset correspondence relationships according to a second preset reference factor can comprise: acquiring attribute information of a contact of an opposite call end and/or scene mode information of an opposite call end; selecting the second preset correspondence relationship from a plurality of optional second preset correspondence relationships according to the attribute information and/or the scene mode information. Advantageous effect of this improvement is similar to that of the aforementioned improvement for a plurality of first preset correspondence relationships, and is not repeated here.

In some embodiments, the first preset loudness threshold value and/or the second preset loudness threshold value, and the first preset amplitude threshold value and/or the second preset amplitude threshold value, can also be determined according to the attribute information and/or scene mode information. For example, the when the sound loudness analysis result includes that the current sound loudness is less than the first preset loudness threshold value, performing raising adjustment for the current sound loudness comprises: acquiring attribute information of a contact of an opposite call end and/or scene mode information of an opposite call end; determining a corresponding first preset loudness threshold value according to the attribute information and/or scene mode information; when the sound loudness analysis result includes that the current sound loudness is less than the first preset loudness threshold value, performing raising adjustment for the current sound loudness. Advantages of such a design are that the determination condition of whether audio signal adjustment is required to be performed can be determined according to the attribute information or scene mode information of the opposite call end, so that the audio signal adjustment is more accurate and targeted. For another instance, the when a current amplitude value in the audio signal is less than a first preset amplitude threshold value, adjusting the current amplitude value into a corresponding first target amplitude comprises: acquiring attribute information of a contact of an opposite call end and/or scene mode information of an opposite call end; determining a corresponding first preset loudness threshold value according to the attribute information and/or scene mode information; when a current amplitude value in the audio signal is less than a first preset amplitude threshold value, adjusting the current amplitude value into a corresponding first target amplitude.

Figure 4:
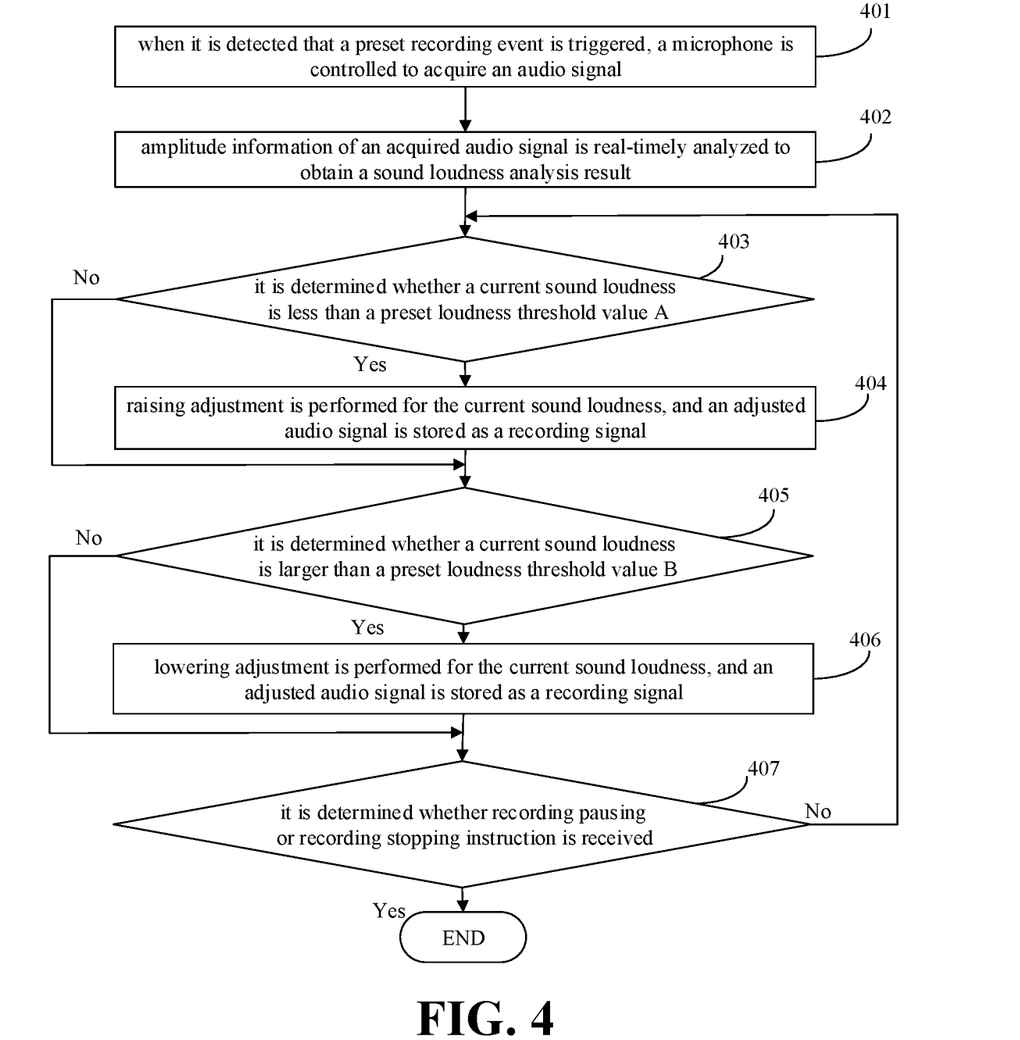
FIG. 4 is a schematic flow chart of another audio signal adjustment method provided by an embodiment of the present disclosure.

FIG. 4 is a schematic flow chart of another audio signal adjustment method provided by an embodiment of the present disclosure, this method is suitable for a recording scene, and specifically comprises the following operations.

Operation 401, when it is detected that a preset recording event is triggered, a microphone is controlled to acquire an audio signal.

Operation 402, amplitude information of an acquired audio signal is real-timely analyzed to obtain a sound loudness analysis result.

Operation 403, it is determined whether a current sound loudness is less than a preset loudness threshold value A; if yes, an operation 404 is executed; otherwise, an operation 405 is executed.

It can be understood that a terminal can real-timely analyze the amplitude information of the audio signal acquired by the microphone as recording goes on, and the current sound loudness continuously changes as the analysis goes on.

Operation 404, raising adjustment is performed for the current sound loudness, and an adjusted audio signal is stored as a recording signal.

Operation 405, it is determined whether a current sound loudness is larger than a preset loudness threshold value B; if yes, an operation 406 is executed; otherwise, an operation 407 is executed.

Operation 406, lowering adjustment is performed for the current sound loudness, and an adjusted audio signal is stored as a recording signal.

Operation 407, it is determined whether recording pausing or recording stopping instruction is received; if yes, the flow is ended; otherwise, it returns to execute the operation 403.

The audio signal adjustment method provided by this embodiment of the present disclosure can dynamically adjust a sound loudness corresponding to an acquired audio signal in a recording process, automatically increase the sound loudness when the sound loudness is too small, and automatically lower the sound loudness when the sound loudness is too large. Good recording effect can be automatically maintained, and users do not require manually adjusting when listening recording. For the situation that recorded sound is sometimes large and sometimes small, advantageous effect of this embodiment of the present disclosure is especially obvious.

Figure 5:
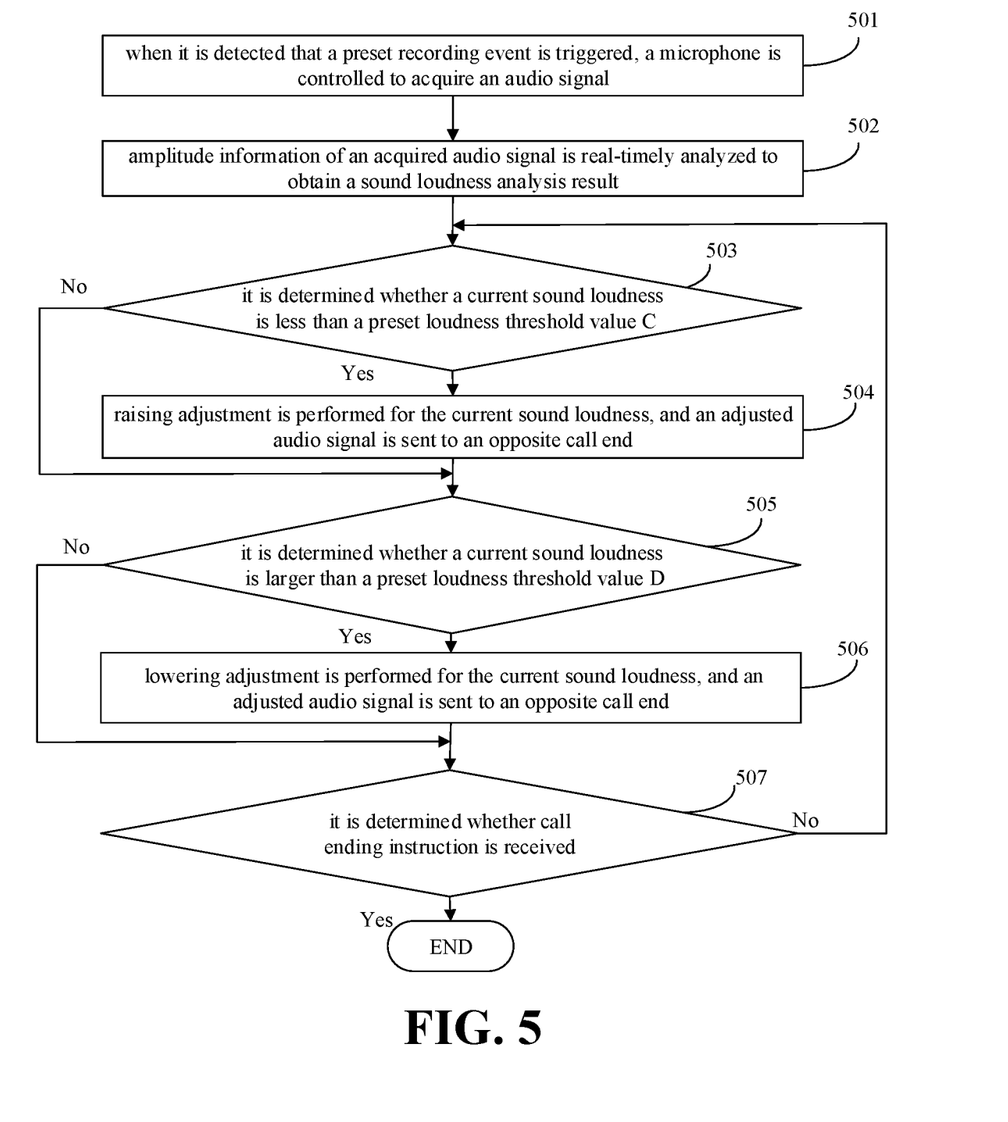
FIG. 5 is a schematic flow chart of another audio signal adjustment method provided by an embodiment of the present disclosure.

FIG. 5 is a schematic flow chart of another audio signal adjustment method provided by an embodiment of the present disclosure, this method is suitable for a call scene, and specifically comprises the following operations.

Operation 501, when it is detected that a preset call event is triggered, a microphone is controlled to acquire an audio signal.

Operation 502, amplitude information of an acquired audio signal is real-timely analyzed to obtain a sound loudness analysis result.

Operation 503, it is determined whether a current sound loudness is less than a preset loudness threshold value C; if yes, an operation 504 is executed; otherwise, an operation 505 is executed.

It can be understood that a terminal can real-timely analyze the amplitude information of the audio signal acquired by the microphone as recording goes on, and the current sound loudness continuously changes as the analysis goes on.

Operation 504, raising adjustment is performed for the current sound loudness, and an adjusted audio signal is sent to an opposite call end.

Operation 505, it is determined whether a current sound loudness is larger than a preset loudness threshold value D; if yes, an operation 506 is executed; otherwise, an operation 507 is executed.

Operation 506, lowering adjustment is performed for the current sound loudness, and an adjusted audio signal is sent to an opposite call end.

Operation 507, it is determined whether call ending instruction is received; if yes, the flow is ended; otherwise, it returns to execute the operation 503.

The audio signal adjustment method provided by this embodiment of the present disclosure can dynamically adjust a sound loudness corresponding to an acquired audio signal in a call process, automatically increase the sound loudness when the sound loudness is too small, and automatically lower the sound loudness when the sound loudness is too large. Good call effect can be automatically maintained, and a user at an opposite call end does not require manually adjusting. For the situation that speaking sound of a local end user is sometimes large and sometimes small, advantageous effect of this embodiment of the present disclosure is especially obvious.

Figure 6:
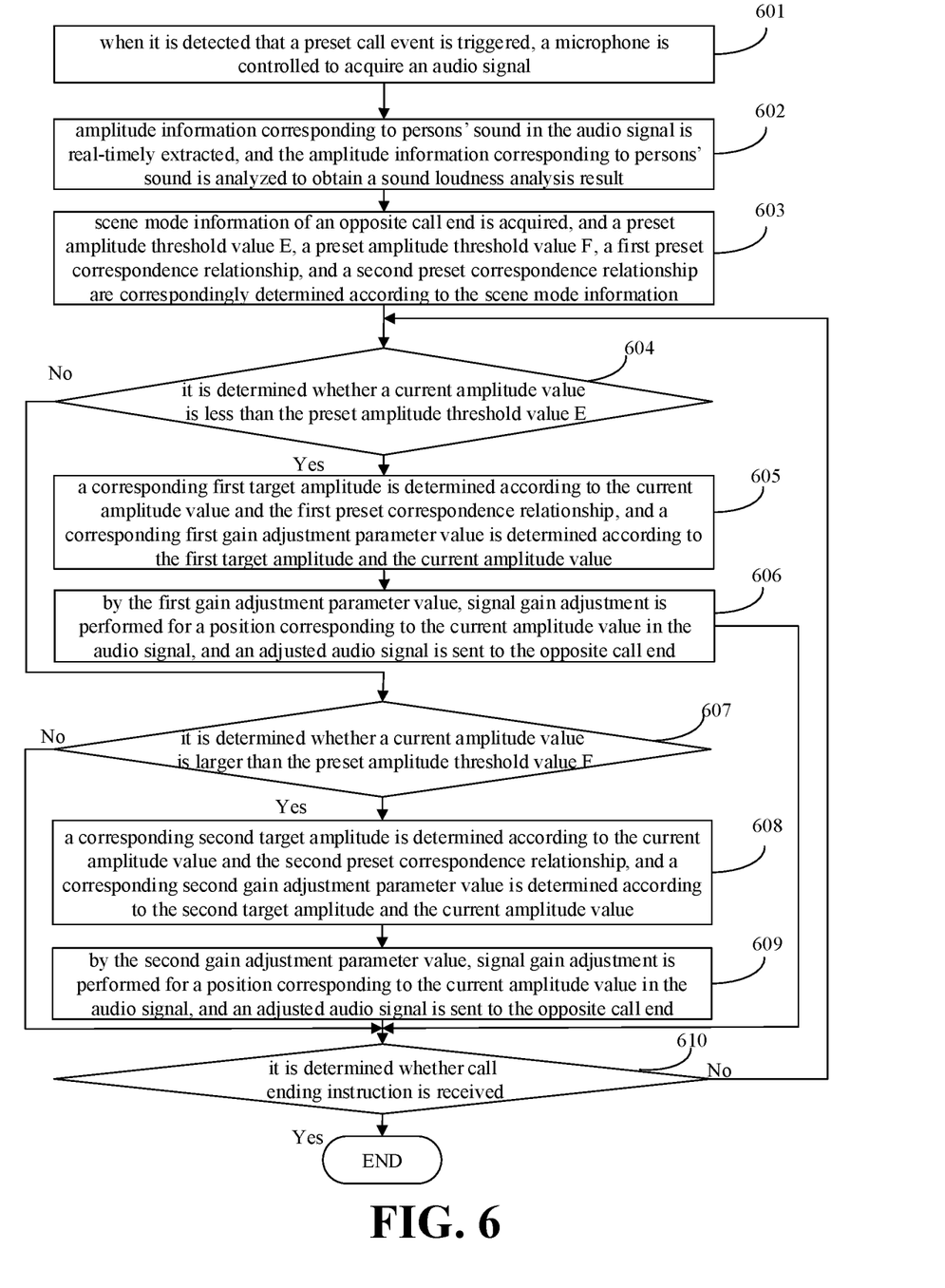
FIG. 6 is a schematic flow chart of another audio signal adjustment method provided by an embodiment of the present disclosure.

FIG. 6 is a schematic flow chart of another audio signal adjustment method provided by an embodiment of the present disclosure, this method is suitable for a call scene, and specifically comprises the following operations.

Operation 601, when it is detected that a preset call event is triggered, a microphone is controlled to acquire an audio signal.

Operation 602, amplitude information corresponding to persons' sound in the audio signal is real-timely extracted, and the amplitude information corresponding to persons' sound is analyzed to obtain a sound loudness analysis result.

Operation 603, scene mode information of an opposite call end is acquired, and a preset amplitude threshold value E, a preset amplitude threshold value F, a first preset correspondence relationship, and a second preset correspondence relationship are correspondingly determined according to the scene mode information.

Operation 604, it is determined whether a current amplitude value is less than the preset amplitude threshold value E; if yes, an operation 605 is executed; otherwise, an operation 607 is executed.

Operation 605, a corresponding first target amplitude is determined according to the current amplitude value and the first preset correspondence relationship, and a corresponding first gain adjustment parameter value is determined according to the first target amplitude and the current amplitude value.

Operation 606, by the first gain adjustment parameter value, signal gain adjustment is performed for a position corresponding to the current amplitude value in the audio signal, and an adjusted audio signal is sent to the opposite call end; an operation 610 is executed.

Operation 607, it is determined whether a current amplitude value is larger than the preset amplitude threshold value F; if yes, an operation 608 is executed; otherwise, an operation 610 is executed.

Operation 608, a corresponding second target amplitude is determined according to the current amplitude value and the second preset correspondence relationship, and a corresponding second gain adjustment parameter value is determined according to the second target amplitude and the current amplitude value.

Operation 609, by the second gain adjustment parameter value, signal gain adjustment is performed for a position corresponding to the current amplitude value in the audio signal, and an adjusted audio signal is sent to the opposite call end.

Operation 610, it is determined whether call ending instruction is received; if yes, the flow is ended; otherwise, it returns to execute the operation 604.

The audio signal adjustment method provided by this embodiment of the present disclosure can adjust a sound loudness corresponding to an audio signal more accurately according to scene mode information of an opposite call party in a call process, and thus can improve call effect more targetedly.

Figure 7:
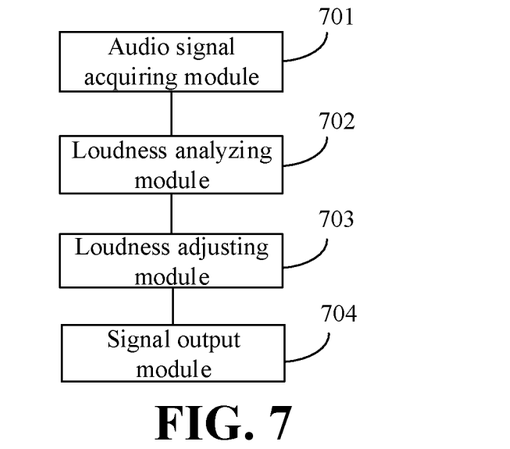
FIG. 7 is a structural diagram of an audio signal adjustment device provided by an embodiment of the present disclosure.

FIG. 7 is a structural diagram of an audio signal adjustment device provided by an embodiment of the present disclosure, the device can be implemented by software and/or hardware, is usually integrated in a terminal, and can adjust audio signals by executing an audio signal adjustment method. As shown in FIG. 7, the device comprises:

an audio signal acquiring module 701 configured to control a microphone to acquire an audio signal when it is detected that a preset event is triggered, wherein the preset event comprises a preset call event and/or a preset recording event;

a loudness analyzing module 702 configured to analyze a sound loudness corresponding to the audio signal;

a loudness adjusting module 703 configured to dynamically adjust the sound loudness corresponding to the audio signal according to an analysis result and a preset adjustment policy;

a signal output module 704 configured to perform corresponding output processing for an adjusted audio signal according to a type of the preset event.

The audio signal adjustment device provided by this embodiment of the present disclosure can analyze a sound loudness corresponding to an audio signal acquired by a microphone in a call or recording process, perform dynamical adjustment according to an analysis result, and then perform corresponding output process. It is not required that an opposite call end itself adjusts a volume, or it is not required that a listener adjusts a volume back and forth when playing recording, and it can be maintained that an audio signal is output according to a preset volume changing law.

Optionally, the signal output module is configured to: when the preset event includes a preset call event, send the adjusted audio signal to an opposite call end; when the preset event includes a preset recording event, store the adjusted audio signal as a recording signal.

Optionally, the loudness analyzing module is configured to: analyze amplitude information of the audio signal to obtain a sound loudness analysis result.

Optionally, the loudness analyzing module is configured to: extract amplitude information corresponding to persons' sound in the audio signal; analyze the amplitude information corresponding to person's sound to obtain the sound loudness analysis result.

Optionally, the loudness adjusting module is configured to: when the sound loudness analysis result includes that a current sound loudness is less than a first preset loudness threshold value, perform raising adjustment for the current sound loudness; and/or when the sound loudness analysis result includes that a current sound loudness is larger than a second preset loudness threshold value, perform lowering adjustment for the current sound loudness.

Optionally, the when the sound loudness analysis result includes that a current sound loudness is less than a first preset loudness threshold value, performing raising adjustment for the current sound loudness comprises: when a current amplitude value in the audio signal is less than a first preset amplitude threshold value, adjusting the current amplitude value into a corresponding first target amplitude, wherein the first target amplitude is larger than or equal to the first preset amplitude threshold value; the when the sound loudness analysis result includes that a current sound loudness is larger than a second preset loudness threshold value, performing lowering adjustment for the current sound loudness comprises: when a current amplitude value in the audio signal is larger than a second preset amplitude threshold value, adjusting the current amplitude value into a corresponding second target amplitude, wherein the second target amplitude is less than or equal to the second preset amplitude threshold value.

Optionally, the adjusting the current amplitude value into a corresponding first target amplitude comprises: determining the corresponding first target amplitude according to the current amplitude value and a first preset correspondence relationship; determining a corresponding first gain adjustment parameter value according to the first target amplitude and the current amplitude value; performing signal gain adjustment for a position in the audio signal corresponding to the current amplitude value using the first gain adjustment parameter value; the adjusting the current amplitude value into a corresponding second target amplitude comprises: determining the corresponding second target amplitude according to the current amplitude value and a second preset correspondence relationship; determining a corresponding second gain adjustment parameter value according to the current amplitude value and the second target amplitude; performing signal gain adjustment for a position in the audio signal corresponding to the second amplitude value using the second gain adjustment parameter value.

Optionally, the loudness adjusting module is further configured to: prior to the determining the corresponding first target amplitude according to the current amplitude value and a first preset correspondence relationship, select the first preset correspondence relationship from a plurality of optional first preset correspondence relationships according to a first preset reference factor; and/or prior to the determining the corresponding second target amplitude according to the current amplitude value and a second preset correspondence relationship, select the second preset correspondence relationship from a plurality of optional second preset correspondence relationships according to a second preset reference factor.

Optionally, when the preset event is a preset call event, the selecting the first preset correspondence relationship from a plurality of optional first preset correspondence relationships according to a first preset reference factor comprises: acquiring attribute information of a contact of an opposite call end and/or scene mode information of an opposite call end; selecting the first preset correspondence relationship from a plurality of optional first preset correspondence relationships according to the attribute information and/or the scene mode information; the selecting the second preset correspondence relationship from a plurality of optional second preset correspondence relationships according to a second preset reference factor comprises: acquiring attribute information of a contact of an opposite call end and/or scene mode information of an opposite call end; selecting the second preset correspondence relationship from a plurality of optional second preset correspondence relationships according to the attribute information and/or the scene mode information.

An embodiment of the present disclosure further provides a storage medium comprising computer executable instruction, the computer executable instruction, when being executed by a computer processor, is configured to execute an audio signal adjustment method, the method comprises: when it is detected that a preset event is triggered, controlling a microphone to acquire an audio signal, wherein the preset event comprises a preset call event and/or a preset recording event; analyzing a sound loudness corresponding to the audio signal; dynamically adjusting the sound loudness corresponding to the audio signal according to an analysis result and a preset adjustment policy; and performing corresponding output processing for an adjusted audio signal according to a type of the preset event.

Storage medium—any of various types of memory devices or storage devices. The term "storage medium" is intended to include: an installation medium, such as a CD-ROM, a floppy disk, or a tape device; a computer system memory or a random access memory, such as a DRAM, a DDR RAM, a SRAM, an EDO RAM, a Rambus RAM, etc.; a non-transitory memory, such as a flash memory, a magnetic medium (such as a hard disk or an optical storage); registers or other similar types of memory elements, and the like. The storage medium may also include other types of memories or combinations thereof. Additionally, the storage medium may be located in a first computer system in which a program is executed, or may be located in a different second computer system, wherein the second computer system is coupled to the first computer system via a network, such as the Internet. The second computer system can provide program instruction to the first computer system for execution. The term "storage medium" can include two or more storage media that can reside in different locations (e.g, in different computer systems connected through a network). A storage medium may store program instruction (e.g., embodied as a computer program) being executable by one or more processors.

Of course, in the storage medium comprising computer executable instruction provided by this embodiment of the present disclosure, the computer executable instruction is not limited to the above audio signal adjustment operations, and can also execute related operations in audio signal adjustment methods provided by any embodiment of the present disclosure.

Figure 8:
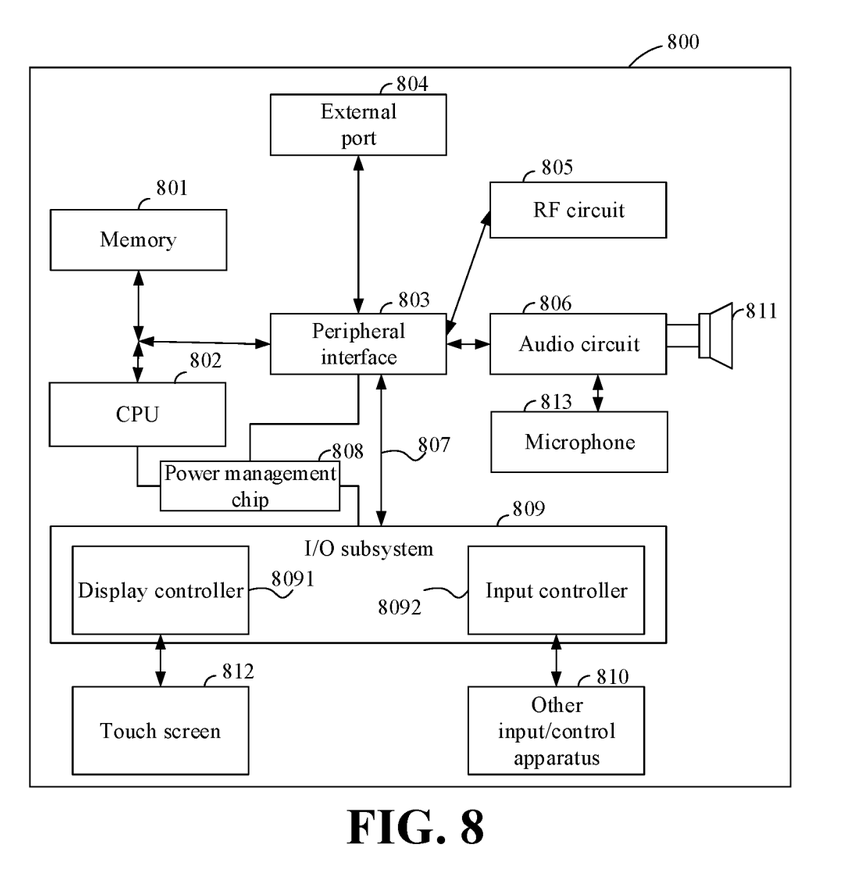
FIG. 8 is a structural schematic view of a terminal provided by an embodiment of the present disclosure.

An embodiment of the present disclosure provides a terminal, the terminal can integrate an audio signal adjustment device provided by an embodiment of the present disclosure therein. FIG. 8 is a structural schematic view of a terminal provided by an embodiment of the present disclosure. The terminal can be, for example, a mobile terminal. As shown in FIG. 8, the terminal can comprise: a housing (not shown in the figure), a memory 801, a central processing unit (CPU) 802 (also known as processor, hereinafter referred to as CPU), a circuit board (not shown in the figure), a power circuit (not shown in the figure), and a microphone 813. The circuit board is disposed inside space enclosed by the housing; the CPU 802 and the memory 801 is disposed on the circuit board; the power circuit is configured to supply power to various circuits or elements of the terminal; the memory 801 is configured to store executable program codes; the CPU 802 reads the executable program codes stored in the memory 801 to run a computer program corresponding to the executable program codes and thereby implement the following operations: when it is detected that a preset event is triggered, controlling the microphone to acquire an audio signal, wherein the preset event comprises a preset call event and/or a preset recording event; analyzing a sound loudness corresponding to the audio signal; dynamically adjusting the sound loudness corresponding to the audio signal according to an analysis result and a preset adjustment policy; and performing corresponding output processing for an adjusted audio signal according to a type of the preset event.

The terminal further comprises: a peripheral interface 803, an RF (Radio Frequency) circuit 805, an audio circuit 806, a loudspeaker 811, a power management chip 808, an input/output (I/O) subsystem 809, a touch screen 812, an other input/control apparatus 810, and an external port 804; these elements communicate through one or more communication bus or signal wire 807.

It should be understood that the terminal 800 shown in the figure is merely an example of the terminal, and the terminal 800 can have parts being more or less than shown in the figure, can combine two or more parts, or can have different part configurations. The various parts shown in the figure can be implemented in hardware including one or more signal processing and/or special integrated circuit, software, or a combination of hardware and software.

The terminal provided by this embodiment configured to adjust audio signals is described in detail below. The terminal takes a mobile phone as an example.

The memory 801. The memory 801 can be accessed by the CPU 802, the peripheral interface 803, etc. The memory 801 can includes a high speed random access memory, and can also include a non-transitory memory, for example, one or more disk storage device, flash memory device, or other non-transitory solid state storage device.

The peripheral interface 803. The peripheral interface 803 can connect input and output peripheral devices of the device to the CPU 802 and the memory 801.

The I/O subsystem 809. The I/O subsystem 809 can connect the input and output peripheral devices of the device, such as the touch display screen 812 and the other input/control apparatus 810, to the peripheral interface 803. The I/O subsystem 809 can include a display controller 8091 and one or more input controllers 8092 configured to control the other input/control apparatus 810. Wherein, the one or more input controllers 8092 receive(s) electric signals from the other input/control apparatus 810 or send(s) electric signals to the other input/control apparatus 810. The other input/control apparatus 810 can include a physical button (push button, rocker button, etc.), a dial, a slide switch, a joystick, a click wheel, etc. It should be noted that the input controller 8092 can be connected with any one of the following: a keyboard, an infrared port, a USB interface, and an indication apparatus such as a mouse.

The touch display screen 812. The touch display screen 812 is an input interface and an output interface between a user terminal and a user, and displays visible output to users; the visible output can include graphics, texts, icons, videos, etc.

The display controller 8091 of the I/O subsystem 809 receives electric signals from the touch display screen 812 or sends electric signals to the touch display screen 812. The touch display screen 812 detects contacts on the touch display screen, the display controller 8091 converts detected contacts into interactions with user interface objects displayed on the touch screen display 812, that is, implements man-machine interaction. The user interface objects displayed on the touch display screen 812 can be an icon of a running game, an icon of connecting with a corresponding network, etc. It should be noted that the device can further include an optical mouse, the optical mouse is a touch sensitive surface which does not display any visible output, or extension of a touch sensitive surface formed by a touch screen.

The RF circuit 805 is mainly configured to establish communication between the mobile phone and a wireless network (i.e., network side), and implement data reception and transmission between the mobile phone and the wireless network, such as receiving and sending short messages, emails, etc. In particular, the RF circuit 805 receives and sends RF signals, the RF signals are also called as electromagnetic signals; the RF circuit 805 converts electric signals into electromagnetic signals or converts electromagnetic signals into electric signals, and communicates with a communication network and other devices by the electromagnetic signals. The RF circuit 805 can include known circuits configured to execute these functions, which include but are not limited to an antenna system, an RF transceiver, one or more amplifier(s), a tuner, one or more oscillator(s), a digital signal processor, a CODEC (COder-DECoder) chip group, a subscriber identity module (SIM), and so on.

The audio circuit 806 is mainly configured to receive audio data from the peripheral interface 803, convert the audio data into electric signals, and send the electric signal to the loudspeaker 811.

The speaker 811 is configured to restore voice signals received from the wireless network through the RF circuit 805 by the mobile phone into sound, and play the sound to users.

The power management chip 808 is configured to supply power and perform power supply management for the CPU 802, the I/O subsystem, and hardware connected to the peripheral interface.

The terminal provided by this embodiment of the present disclosure can analyze a sound loudness corresponding to an audio signal acquired by a microphone in a call or recording process, perform dynamical adjustment according to an analysis result, and then perform corresponding output process. It is not required that an opposite call end itself adjusts a volume, or it is not required that a listener adjusts a volume back and forth when playing recording, and it can be maintained that an audio signal is output according to a preset volume changing law.

The audio signal adjustment device, the storage medium, and the terminal provided by the above embodiments can execute an audio signal adjustment method provided by any embodiment of the present disclosure, and have corresponding functional modules for and advantageous effect of executing the method. Technical details which are not described in detail in the above embodiments can refer to an audio signal adjustment method provided by any embodiment of the present disclosure.

It should be noted that the above are merely preferred embodiments and utilized technical principles of the present disclosure. Those skilled in the art can understand that the present disclosure is not limited to the specific embodiments described here. For those skilled in the art, it is possible to perform various obvious changes, re-adjustments, and replacements without departing from the protection scope of the present disclosure. Therefore, although the present disclosure is illustrated in detail by the above embodiments, the present disclosure is not limited to the above embodiments; more other equivalent embodiments can also be included without departing from the concept of the present disclosure, and the scope of the present disclosure is determined by the scope of appended claims.

What is claimed is:

1. A method for audio adjustment, comprising:
when it is detected that a preset event is triggered, controlling a microphone to acquire an original audio signal, wherein the preset event comprises at least one of a preset call event or a preset recording event;
analyzing a sound loudness corresponding to the original audio signal acquired by the microphone to obtain a sound loudness analysis result;
dynamically adjusting the sound loudness corresponding to the original audio signal according to the sound loudness analysis result and a preset adjustment policy to obtain an adjusted audio signal, comprising:
determining a target amplitude according to a current amplitude value of the original audio signal and a preset correspondence relationship, wherein the preset correspondence relationship is determined according to at least one of attribute information of a contact of an opposite call end or scene mode information of an opposite call end, the attribute information includes age information of contacts extracted from remark information in an address book or determined by voice recognition, and the scene mode information is acquired by sending a scene mode information acquiring request to the opposite call end and receiving scene mode information returned according to the scene mode information acquiring request by the opposite call end;
determining a gain adjustment parameter value according to the target amplitude and the current amplitude value; and
performing signal gain adjustment for a portion in the original audio signal corresponding to the current amplitude value using the gain adjustment parameter value to obtain the adjusted audio signal;
performing corresponding output processing for the adjusted audio signal according to a type of the triggered preset event; and
during the output processing or after the output processing, playing the adjusted audio signal without adjusting a volume of the adjusted audio signal.

2. The method according to claim 1, wherein, the performing the corresponding output processing for the adjusted audio signal according to the type of the triggered preset event comprises:
 when the triggered preset event includes a preset call event, sending the adjusted audio signal to an opposite call end; and
 when the triggered preset event includes a preset recording event, storing the adjusted audio signal as a recording signal.

3. The method according to claim 2, wherein, the analyzing the sound loudness corresponding to the original audio signal acquired by the microphone to obtain a sound loudness analysis result comprises:
 analyzing amplitude information of the original audio signal to obtain the sound loudness analysis result.

4. The method according to claim 3, wherein, the analyzing the amplitude information of the original audio signal to obtain the sound loudness analysis result comprises:
 extracting amplitude information corresponding to persons' sound in the original audio signal; and
 analyzing the amplitude information corresponding to person's sound to obtain the sound loudness analysis result.

5. The method according to claim 3, wherein, the dynamically adjusting the sound loudness corresponding to the original audio signal according to the sound loudness analysis result and the preset adjustment policy comprises at least one of:
 when the sound loudness analysis result includes that a current sound loudness is less than a first preset loudness threshold value, performing raising adjustment for the current sound loudness; or
 when the sound loudness analysis result includes that a current sound loudness is larger than a second preset loudness threshold value, performing lowering adjustment for the current sound loudness.

6. The method according to claim 5, wherein, the target amplitude comprises a first target amplitude and a second target amplitude; the when the sound loudness analysis result includes that the current sound loudness is less than the first preset loudness threshold value, performing the raising adjustment for the current sound loudness comprises:
 when the current amplitude value of the original audio signal is less than a first preset amplitude threshold value, adjusting the current amplitude value into the first target amplitude, wherein the first target amplitude is larger than or equal to the first preset amplitude threshold value; and
 the when the sound loudness analysis result includes that the current sound loudness is larger than the second preset loudness threshold value, performing lowering adjustment for the current sound loudness comprises:
 when the current amplitude value of the original audio signal is larger than a second preset amplitude threshold value, adjusting the current amplitude value into the second target amplitude, wherein the second target amplitude is less than or equal to the second preset amplitude threshold value.

7. The method according to claim 6, wherein, the preset correspondence relationship comprises a first correspondence relationship and a second correspondence relationship, and the gain adjustment parameter comprises a first gain adjustment parameter and a second gain adjustment parameter; the adjusting the current amplitude value into the corresponding first target amplitude comprises:
 determining the first target amplitude according to the current amplitude value and the first preset correspondence relationship;
 determining the first gain adjustment parameter value according to the first target amplitude and the current amplitude value; and
 performing signal gain adjustment for a portion of the original audio signal corresponding to the current amplitude value using the first gain adjustment parameter value; and
 the adjusting the current amplitude value into the second target amplitude comprises:
 determining the second target amplitude according to the current amplitude value and the second preset correspondence relationship;
 determining the second gain adjustment parameter value according to the current amplitude value and the second target amplitude; and
 performing signal gain adjustment for a portion of the original audio signal corresponding to the current amplitude value using the second gain adjustment parameter value.

8. The method according to claim 7, wherein the method further comprises:
 prior to the determining the first target amplitude according to the current amplitude value and a first preset correspondence relationship,
 selecting the first preset correspondence relationship from a plurality of optional first preset correspondence relationships according to a first preset reference factor; and
 prior to the determining the second target amplitude according to the current amplitude value and a second preset correspondence relationship,
 selecting the second preset correspondence relationship from a plurality of optional second preset correspondence relationships according to a second preset reference factor.

9. The method according to claim 8, wherein, when the preset event is a preset call event, the selecting the first preset correspondence relationship from the plurality of optional first preset correspondence relationships according to the first preset reference factor comprises:
 acquiring at least one of attribute information of a contact of an opposite call end or scene mode information of an opposite call end; and
 selecting the first preset correspondence relationship from a plurality of optional first preset correspondence relationships according to the at least one of the attribute information or the scene mode information; and
 the selecting the second preset correspondence relationship from the plurality of optional second preset correspondence relationships according to the second preset reference factor comprises:
 acquiring at least one of attribute information of a contact of an opposite call end or scene mode information of an opposite call end; and
 selecting the second preset correspondence relationship from a plurality of optional second preset correspondence relationships according to the at least one of the attribute information or the scene mode information.

* * * * *